(12) United States Patent
Nelson

(10) Patent No.: US 6,176,934 B1
(45) Date of Patent: Jan. 23, 2001

(54) INFLATABLE DOOR SEAL

(75) Inventor: Gordon R. Nelson, Kalispell, MT (US)

(73) Assignee: Semitool, Inc., Kalispell, MT (US)

(*) Notice: Under 35 U.S.C. 154(b), the term of this patent shall be extended for 0 days.

(21) Appl. No.: 09/397,220

(22) Filed: Sep. 16, 1999

(51) Int. Cl.[7] .................................................. C23C 16/00

(52) U.S. Cl. ........................ 118/733; 118/715; 49/499.1

(58) Field of Search ................................... 118/733, 715; 49/477.1, 475.1, 484.1, 489.1, 498.1, 499.1

(56) References Cited

U.S. PATENT DOCUMENTS 5,209,498 * 5/1993 Colin .................................. 49/477.1

* cited by examiner

Primary Examiner—Jeffrie R. Lund
Assistant Examiner—Sylvia R. MacArthur
(74) Attorney, Agent, or Firm—Lyon & Lyon LLP

(57) ABSTRACT

A semiconductor article processor sprays processing chemicals on a semiconductor article or wafer within a chamber. A door with an inflatable resilient seal, seals the chamber closed during processing. A seal support on the door extends radially outwardly into the inflatable seal, to better hold the seal onto the door. Inflation pressures can be increased, and the accumulation of chemical residues around the inflatable seal are decreased. Consequently, the effectiveness and reliability of the inflatable seal is improved.

14 Claims, 4 Drawing Sheets

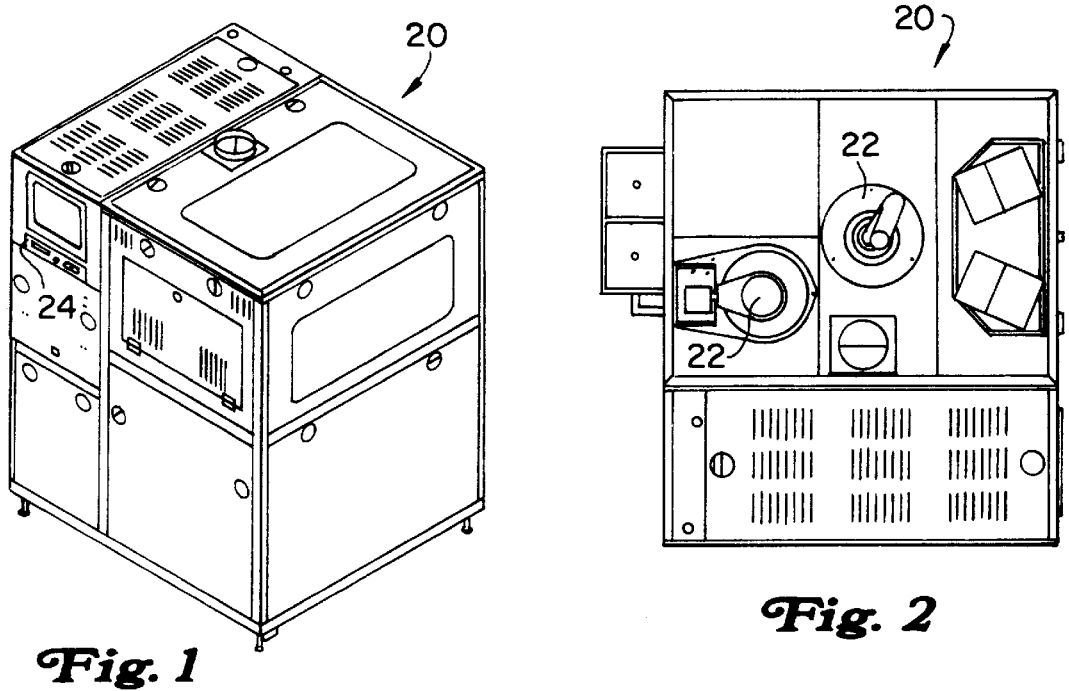
Fig. 1
Fig. 2
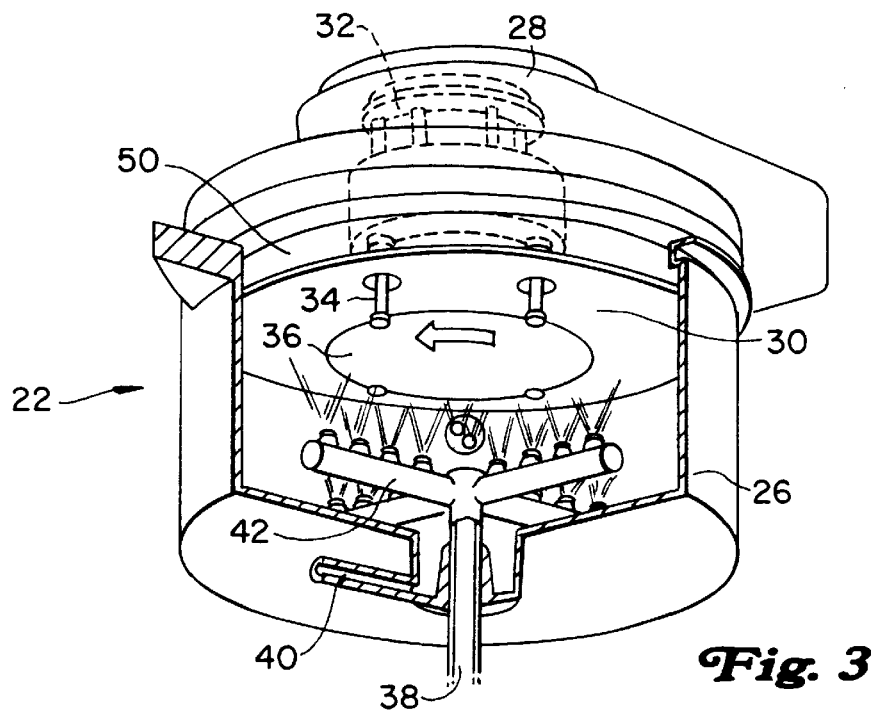
Fig. 3

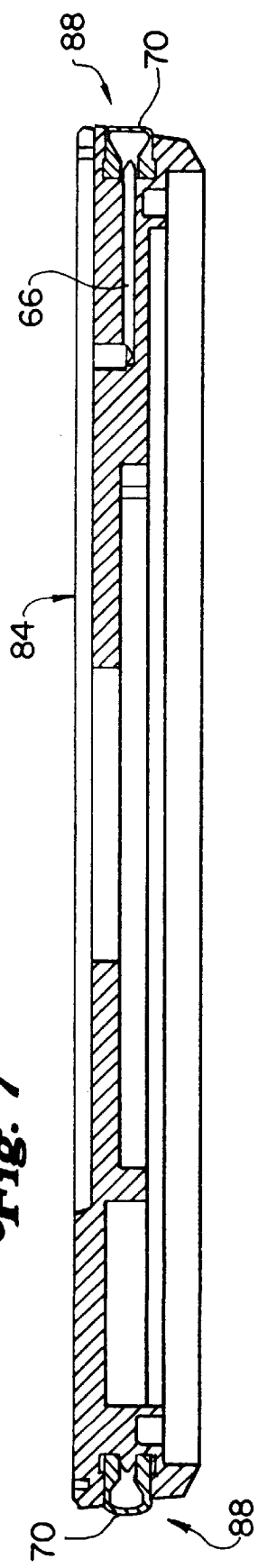
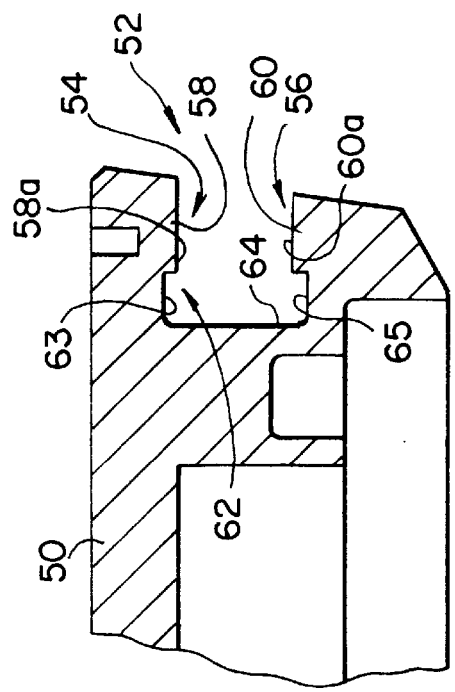
Fig. 7
Fig. 6 (PRIOR ART)

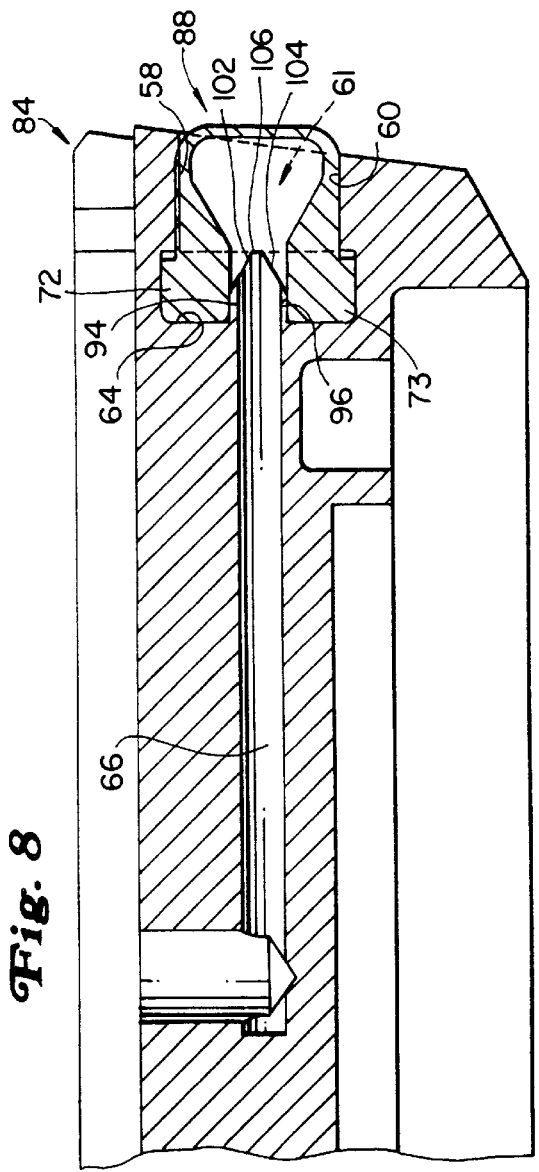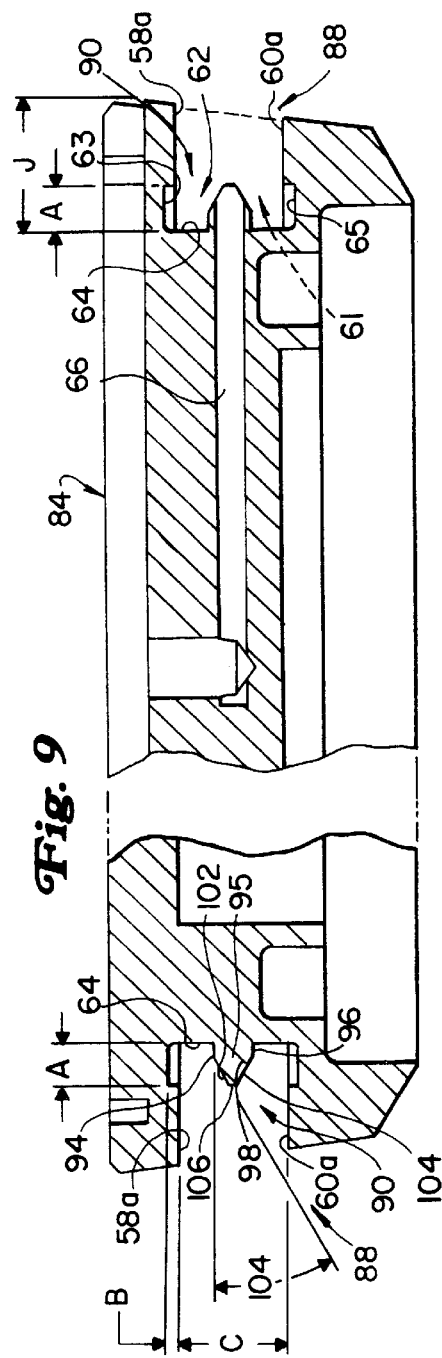

INFLATABLE DOOR SEAL

FIELD OF THE INVENTION

The field of the invention is semiconductor processing equipment used to process semiconductor articles, such as, substrates, wafers, photo masks, data disks, flat panel displays, and similar articles.

BACKGROUND OF THE INVENTION

Semiconductor processing or manufacturing equipment use various types of processing chemicals in the form of fluids and/or vapors or gases. The processing equipment carries out processes such as, etching, cleaning, plating, stripping, and other processes as well, which typically will be one of many steps involved in manufacturing a semiconductor article. The fluids and/or vapors or gasses applied during processing, include acids, caustics, etchants, solvents, water, and others.

In many applications, the semiconductor articles are rotated at high speed, within a processing module, while the semiconductor articles, most often silicon wafers, are exposed to the processing chemicals.

Various types of semiconductor processing equipment are used. In one common type, a drive head is positioned on top of a process chamber. A door on the drive head seals against the chamber, during processing, to prevent processing chemicals from escaping from the chamber. The door has an inflatable seal. During processing, the seal is inflated using compressed air, to seal the door onto the chamber. The inflatable seal is held into a groove on the door.

While these types of designs have worked well, certain disadvantages remain. The seal may only be inflated to a nominal pressure, to avoid having the seal move or blow out of the groove in the door. Consequently, sealing effectiveness can be limited. In addition, chemical residue can build up behind the sealing door surfaces, reducing the effectiveness of the inflatable seal. Accordingly, it is an object of the invention to provide a semiconductor article processor having an improved door seal.

SUMMARY OF THE INVENTION

To this end, in a first aspect of the invention, a semiconductor article processor has a chamber for processing semiconductor articles. A door for sealing the chamber has an annular groove structure formed by first and second spaced apart annular groove walls, extending radially outwardly from an inner groove wall. First and second shoulders on the first and second annular groove walls extend inwardly towards each other. An annular seal support extends radially outwardly from the inner groove wall, in between the first and second annular groove walls. An inflatable annular seal is provided within the annular groove structure. The seal support extends radially outwardly into the inflatable seal. Consequently, the inflatable seal is held tightly in place, and can be inflated to higher pressures.

In a second aspect of the invention, the inflatable seal has first and second arms joined to a seal face. The seal support extends in between the first and second arms, holding the arms into an undercut groove in the door, to securely hold the inflatable groove onto the door.

In a third aspect of the invention, the groove support extends radially outwardly to, but not beyond, the first and second shoulders of the annular groove structure.

In a fourth aspect of the invention, th e seal support has a straight section extending radially outwardly from the inner groove wall, and a tapered section joined to the straight section.

Other features and advantages will appear hereinafter.

BRIEF DESCRIPTION OF THE DRAWINGS

In the drawings, wherein the same reference number denotes the same element, throughout the several views:

FIG. 1 is a perspective view of a semiconductor article processor.

FIG. 2 is a plan view thereof.

FIG. 3 is a cut away perspective view of one of the process modules of the semiconductor article processor shown in FIGS. 1 and 2.

FIG. 6 is an enlarged section view of the door shown in FIGS. 4 and 5, with the inflatable seal removed, for clarity of illustration.

FIG. 7 is a section view of the door of the invention, having an improved annular seal groove structure.

FIG. 8 is an enlarged section view thereof.

FIG. 9 is an enlarged section view of the door of FIG. 7, with the inflatable seal removed, for clarity of illustration.

DETAILED DESCRIPTION OF THE DRAWINGS

Figure 4:
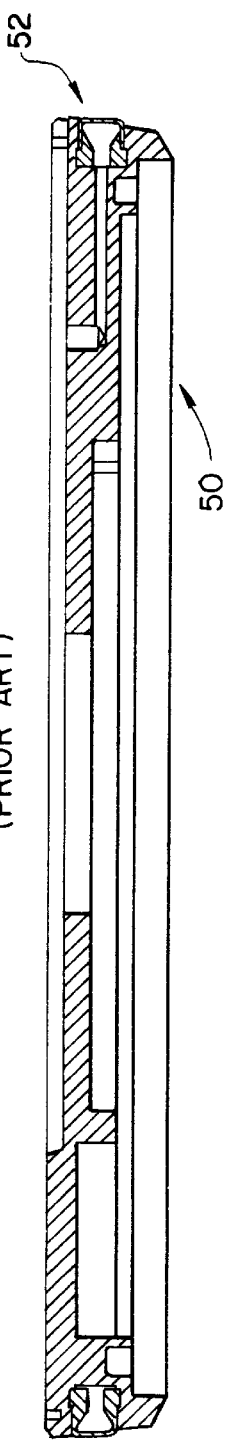
FIG. 4 is a section view of a prior art process module door and inflatable seal.

Turning now in detail to the drawings, as shown in FIGS. 1 and 2, a semiconductor article processor 20 has process modules 22 for carrying out various semiconductor manufacturing steps, such as etching, cleaning, stripping, plating, etc. A control panel 24 controls operation of the modules 22, and other functions.

Referring to FIG. 3, as is well known in the field, a process module 22 has a drive head 28 positioned on top of a chamber 26. Fingers 34 on a rotor 30 on the drive head 28 hold a wafer 36 or other article to be processed. A motor 32 within the drive head 28 spins the rotor 30 and wafer 36, during processing. A fluid supply 38 at the bottom of the chamber 26 provides processing fluids and/or gasses or vapors to a spray manifold 42. Used fluids are removed via a drain 40. A door 50 on the drive head 28 seals the chamber 26.

Figure 5:
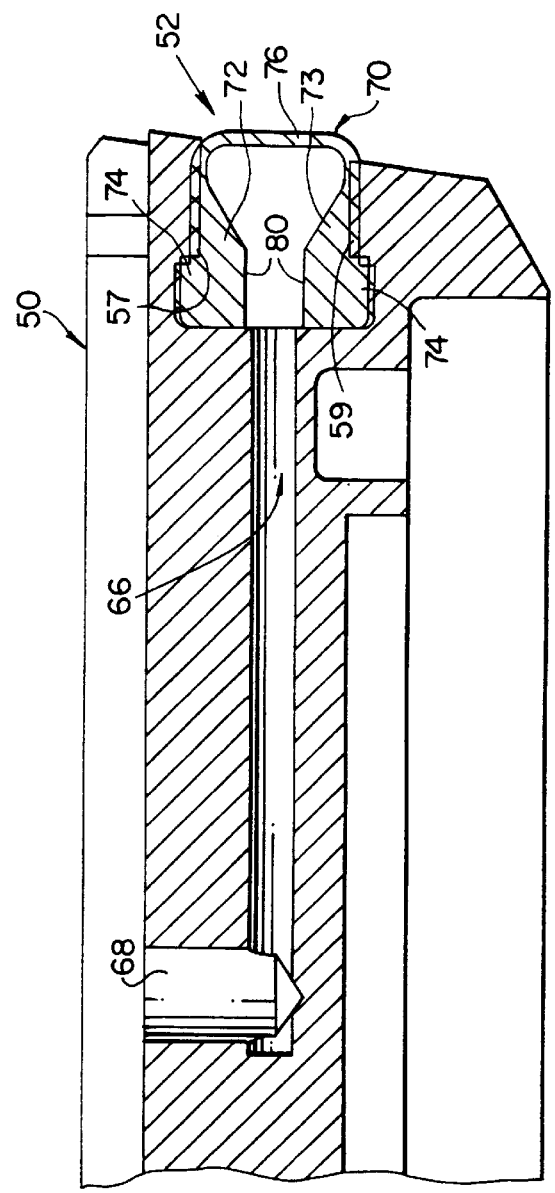
FIG. 5 is an enlarged detail view of the door shown in FIG. 4.

Referring to FIGS. 4, 5 and 6, the round disk-shaped door 50 includes an annular groove structure 52, around its outside perimeter. The groove structure 52 includes a top groove wall and a bottom groove wall, generally indicated at 54 and 56. A top shoulder 58 and a bottom shoulder 60 extend inwardly and are parallel to each other. An undercut groove 62 is formed between a flat back wall 64, top and bottom undercut walls 63 and 65, and the inside surfaces of the top and bottom shoulders 58 and 60. The groove structure 52 is defined by: the inside facing walls 58a and 60a of the shoulders 58 and 60; the inside surfaces 57 and 59 (in FIG. 5) of the shoulders 58 and 60; the undercut walls 63 and 65; and the back wall 64. The top groove wall 54 includes walls 58a; 57 and 63. The bottom groove wall 56 includes walls 60a, 59 and 65.

Referring to FIG. 5, an inflation port 66 is connected to a compressed air source 68, and extends through the door 50 to the groove structure 52. The groove structure 52 has the cross section shown in FIG. 6, all around, except at the single location having the inflation port 66.

Referring still to FIG. 5, an inflatable seal 70 is positioned within the groove structure 52. The seal 70 has top and bottom arms 72 and 73 joined to a seal face section 76. The arms 72 and 73 have thickened sections including a step 74, dimensioned to fit into the undercut groove 62. The arms have flat and straight inner surfaces 80.

With the design shown in FIGS. 4, 5, and 6, it has now been discovered that excessive inflation causes the seal 70 to become displaced from the groove structure 52, degrading sealing performance. In addition, chemical residue can build up between the groove structure 52 and the arms 72 and 73 of the seal 70, also potentially degrading sealing effectiveness.

These disadvantages have been reduced or overcome with a new module door 84 having an improved groove structure 88, as shown in FIGS. 7, 8, and 9. As best shown at the left side of FIG. 9, the improved groove structure 88 includes a seal support 90 extending radially outwardly from the flat back wall 64 of the door 84. The seal support 90 has flat and straight top and bottom walls 94 and 96. The walls 94 and 96 are flat and straight in that they are parallel to the plane of the door 84 and to the inside facing walls 58a and 60a of the top and bottom shoulders 58 and 60.

A tapered or angled section of the seal support 90 extends radially outwardly from the straight section 95 of the seal support formed by the top and bottom seal support walls 94 and 96. The top and bottom angled walls 102 and 104 forming the tapered section 98 terminate at a flat end face or tip 106. The door 84 has the groove structure 88 shown in FIG. 9, around its entire circumference, except where the inflation port 66 is located. As shown in FIGS. 8 and 9, at that location, the inflation port extends radially outwardly through the seal support 90. As shown in FIG. 9, the seal support 90 extends radially outwardly entirely through the undercut groove 62 (by dimension A outwardly from the back wall 64), to the circumference where the top and bottom shoulders 58 and 60 begin.

Referring to FIG. 8, the seal support 90 holds the arms 72 and 73 of the seal 70 up and down to secure them behind the shoulders 58 and 60, in the undercut groove 62.

Referring to FIG. 9, the seal support 90 extends radially outwardly from the flat back wall 64 by a dimension A, preferably in the range of 0.1–0.25 inches, and 0.15 in the embodiment shown. The entire groove structure 88 extends outwardly from the wall 64 substantially further, by dimension J, preferably 0.3–0.5 inches, and 0.4 in the embodiment shown. The undercut groove 62 extends up and down behind the shoulders 58 and 60 by dimension B, preferably 0.01–0.06, and 0.04 in the embodiment shown. The spacing C between the shoulder surfaces 58a and 60a, preferably ranges from 0.2–0.5, and in the embodiment shown, is 0.3 inches. The seal support 90 is preferably centered in the undercut groove 62 and in the space or groove 61 formed in between the shoulder surfaces 58a and 58b, as shown in dotted lines in FIG. 8.

In use, the new door 84 is operated in the same way as the existing door 50. Specifically, after a semiconductor article or wafer is loaded onto the drive head 28, the drive head moves down to engage the chamber 26. The seal 70 is inflated to seal the door 84 against the chamber 26. However, referring to FIG. 8, the seal support 90 secures the arms 72 and 73 of the seal 70 within the groove structure 88. Consequently, the seal 70 can be inflated to higher pressures, without blowing out of the groove structure 88. This allows for improved sealing. In addition, as the arms 72 and 73 of the seal 70 are held outwardly in the undercut groove 62, accumulation of chemical residue between the groove structure 88 and seal 70 is reduced. Consequently, sealing reliability is improved. The design features and operations of the new door 84 are the same as the existing door 50, except for the improvements described above. The new door 84 may be used on machines for processing a single wafer or article, or for processing batches of articles.

Various modifications and substitutions may of course be made without departing from the spirit and scope of the invention. Accordingly, the invention should not be limited, except by the following claims, and their equivalents.

What is claimed is:

1. A semiconductor article processor, comprising:
    a chamber for processing semiconductor articles;
    a door for sealing the chamber, the door having an annular seal groove structure formed by:
        first and second spaced apart annular groove walls extending radially outwardly from an inner groove wall, and with first and second shoulders on the first and second annular groove walls, respectively;
        an annular seal support extending radially outwardly from the inner groove wall, between the first and second annular groove walls; and
    an inflatable annular seal on the door, the annular seal having first and second arms joined to a seal face section, with the annular seal support extending radially outwardly between the first and second arms, thereby inhibiting the seal from moving out of the annular seal groove structure when the annular seal is inflated.

2. The semiconductor article processor of claim 1 with the first and second groove walls and shoulders, and the back wall, forming an undercut groove, and with the seal support extending radially outwardly entirely through the undercut groove.

3. The semiconductor article processor of claim 2 wherein the first and second shoulders are spaced apart by an annular shoulder space and wherein the seal support extends entirely through the undercut groove, but does not extend into the shoulder space.

4. The semiconductor article processor of claim 1 wherein the ratio of the height of the seal support to the height of the undercut groove is 3:10.

5. The semiconductor article processor of claim 1 further comprising an inflation port connected to a compressed air source, and extending through the door and through the annular seal support, to provide compressed air into the annular seal.

6. The semiconductor article processor of claim 1 wherein the ratio of the radial length of the seal support from the inner groove wall to the length of the first annular groove wall is 0.2 to 0.5.

7. The semiconductor article processor of claim 6 wherein the ratio is 0.35.

8. The semiconductor article processor of claim 1 wherein the arms of the annular seal fit line to line between the undercut groove walls and the annular seal support, such that the arms cannot move away from the undercut groove walls, when the seal is inflated.

9. The semiconductor article processor of claim 1 wherein the seal support is centered between the undercut groove side walls.

10. The semiconductor article processor of claim 1 wherein the seal support is formed as an integral part of the door.

11. The semiconductor article processor of claim 1 wherein the seal support extends radially outwardly from the inner wall by a distance of 0.1 to 0.25 inches.

12. A semiconductor article processor, comprising:
    a chamber for processing semiconductor articles;

a door for sealing the chamber, the door having an annular seal groove structure formed by first and second spaced apart annular groove walls extending radially outwardly from an inner groove wall, and with first and second shoulders on the first and second annular groove walls, respectively, and an annular seal support extending radially outwardly from the inner groove wall, between the first and second annular groove walls, with the seal support having a straight section joined to the back wall of the annular groove structure, and a tapered section joined to the straight section, and an annular seal on the door, the annular seal having first and second arms joined to a seal face section, with the annular seal support extending radially outwardly between the first and second arms.

13. The semiconductor article processor of claim 2 wherein the undercut groove side walls are parallel to the shoulder walls and are also parallel to the straight section of the seal support.

14. A semiconductor article processor, comprising:

a chamber for processing semiconductor articles;

a door for sealing the chamber the door having an annular seal groove structure formed by first and second spaced apart annular groove walls extending radially outwardly from an inner groove wall, and with first and second shoulders on the first and second annular groove walls, respectively, and an annular seal support extending radially outwardly from the inner groove wall, between the first and second annular groove walls, with the seal support having a straight section joined to the back wall of the annular groove structure, and a tapered section joined to the straight section, wherein the tapered section has first and second walls extending at an angle of 20°–50° to the straight section, and an annular seal on the door the annular seal having first and second arms joined to a seal face section, with the annular seal support extending radially outwardly between the first and second arms.

* * * * *